United States Patent
Rapoport et al.

(10) Patent No.: US 8,950,363 B2
(45) Date of Patent: Feb. 10, 2015

(54) MRI WITH MAGNET ASSEMBLY ADAPTED FOR CONVENIENT SCANNING OF LABORATORY ANIMALS

(75) Inventors: Uri Rapoport, Moshav Ben Shemen (IL); Itzchak Rabinovitz, Nes Ziona (IL)

(73) Assignee: Aspect Imaging Ltd, Shoham (IL)

( * ) Notice: Subject to any disclaimer, the term of this patent is extended or adjusted under 35 U.S.C. 154(b) by 307 days.

(21) Appl. No.: 13/241,378

(22) Filed: Sep. 23, 2011

(65) Prior Publication Data
US 2012/0073511 A1    Mar. 29, 2012

Related U.S. Application Data (60) Provisional application No. 61/387,538, filed on Sep. 29, 2010.

(51) Int. Cl.
| | |
|---|---|
| *A01K 1/03* | (2006.01) |
| *G01R 33/30* | (2006.01) |
| *G01R 33/341* | (2006.01) |
| *G01R 33/383* | (2006.01) |

(52) U.S. Cl.
CPC .............. *G01R 33/30* (2013.01); *G01R 33/341* (2013.01); *G01R 33/383* (2013.01)
USPC ........................................................ 119/420

(58) Field of Classification Search
CPC ....... A01K 1/03; A01K 15/04; A01K 1/0613; A61D 3/00; A61D 7/00; A61D 7/04; A61G 13/06; A61B 5/035; A61B 5/055; A61M 16/01
USPC ........ 119/420, 421, 752, 28.5, 311, 326, 416, 119/677, 678, 712, 722, 723, 724, 756, 119/753; 600/410, 407, 415, 21, 22; 128/203.12, 203.15, 203.25, 205.19, 128/910, 911, 204.18, 204.21, 202.12, 128/205.26
See application file for complete search history.

(56) References Cited

U.S. PATENT DOCUMENTS

| | | | | |
|---|---|---|---|---|
| 3,367,632 A | * | 2/1968 | Vail .............................. | 119/428 |
| 3,986,480 A | * | 10/1976 | Vail .............................. | 119/428 |
| 4,084,814 A | * | 4/1978 | Boggild ........................ | 482/33 |
| 4,332,244 A | * | 6/1982 | Levy et al. ................. | 128/205.25 |
| 4,771,785 A | * | 9/1988 | Duer ............................ | 600/415 |
| 4,875,485 A | * | 10/1989 | Matsutani .................... | 600/415 |
| 5,085,219 A | | 2/1992 | Ortendahl et al. | |
| 5,167,160 A | * | 12/1992 | Hall, II ..................... | 73/864.91 |

(Continued)

OTHER PUBLICATIONS

"MR-Technology Information Portal", Retrieved at <<http://www.mr-tip.com>>, Sep. 23, 2011.

*Primary Examiner* — Rob Swiatek
*Assistant Examiner* — Ebony Evans
(74) *Attorney, Agent, or Firm* — The Law Office of Michael E. Kondoudis (57) ABSTRACT

An animal handling system (AMS), for positioning an immobilized animal in a predefined configuration therein, including: a proximal portion, held outside a medical device including: at least one inner shaft, and at least one outer shaft, the at least one inner is telescopically maneuverable within the at least one outer shaft providing a variable telescopic mechanism; and a distal portion including: a configurable encapsulable life support system (ELSS), the ELSS is rotatable about a longitudinal axis of the at least one outer shaft and the at least inner shaft and translationally moveable parallel to the longitudinal axis by means of the maneuverable telescopic mechanism.

8 Claims, 6 Drawing Sheets

(56) References Cited

U.S. PATENT DOCUMENTS

| | | | |
|---|---|---|---|
| 6,137,291 A * | 10/2000 | Szumowski et al. | 324/318 |
| 6,609,325 B2 * | 8/2003 | Harris | 42/122 |
| 7,121,229 B2 * | 10/2006 | Hong | 119/421 |
| 7,345,483 B2 * | 3/2008 | Vaughan | 324/318 |
| 8,342,136 B2 * | 1/2013 | Hadjioannou et al. | 119/755 |
| 2010/0198047 A1 * | 8/2010 | Zagorchev et al. | 600/411 |
| 2012/0073509 A1 * | 3/2012 | Rapoport et al. | 119/420 |
| 2012/0278990 A1 * | 11/2012 | Lanz et al. | 5/601 |
| 2012/0330130 A1 * | 12/2012 | Lanz et al. | 600/411 |

\* cited by examiner

Fig. 6c ent MRI device, comprising
MRI WITH MAGNET ASSEMBLY ADAPTED FOR CONVENIENT SCANNING OF LABORATORY ANIMALS

FIELD OF THE INVENTION

The present invention generally pertains to MRI with magnet assembly adapted for convenient scanning of laboratory animals.

BACKGROUND

Commercially available MRI devices typically consist of main magnets which are positioned in parallel and horizontally. Surface coils (also known as surface plates) are essentially loops of conducting material, such as copper tubing. Surface coils are commonly positioned in a plane being substantially perpendicular to the plane of the main magnets. The surface coils are placed directly on or over the region of interest for increased magnetic sensitivity.

The positioning of the coil is an important determinant of performance. As only the region close to the surface coil will contribute to the signal, there is an improvement in the signal to noise ratio for these regions, compared to the use of receiver coils that surround the appropriate part of the body. These coils are specifically designed for localized body regions, and provide improved signal to noise ratios by limiting the spatial extent of the excitation or reception.

The effective free space within an MRI device, especially lab-scale and experimental MRI devices is very much limited. The distance between the scanned object and the main magnet is significantly wider as compared with the distance to the surface coils. This is truer when surface coils are utilized. Scanned objects, as such as neonates and laboratory animals, e.g., rats and mice, are preferably scanned when they are immobilized in a perfect horizontal configuration. When main magnets are positioned horizontally, surface coils are usually positioned vertically. The irregular body of the animal to be scanned is somewhat compressible along the vertical plane whilst it is substantially non compressible along the horizontal plane. Hence, either the MRI device is designed to be big enough to accommodate the object, and thus the device is much more expensive, or the scanning resolution is relatively low.

A few patents disclose means for overcoming those drawbacks, and present methods for positioning and securing the RF surface coil at a predetermined configuration. Hence for example, U.S. Pat. No. 5,085,219 ('219) discloses an adjustable holder for a magnetic resonance imaging RF surface coil for imaging a part of the body such as the temporomandibular joint. Elements are provided for positioning and securing the RF surface coil at a first predetermined point along a longitudinal axis of the holder and for positioning and securing the RF surface coil at a second predetermined point transverse to the longitudinal axis and at a radial distance R from the longitudinal axis. Patent '219 shows that the surface coil may be adjusted along a path transverse to the longitudinal axis by way of an adjustable shaft or arm which can be moved inwardly and outwardly, and the surface coil can be pivoted in a step-wise manner using a pivot head having a plurality of equally spaced detents. This technology is not implementable in small laboratory-scale MRI devices and scanned object must be tilted and otherwise maneuvered such that optimal imaging is obtained None of the above provides a simple solution for precise positioning of the animal within an MRI device. Hence an MRI-compatible and positioning system fulfill a long felt need.

BRIEF SUMMARY

It is thus one object of the invention to disclose an MRD comprising a plurality of main magnets positioned in a substantial horizontal plane and a plurality of surface plates or coils magnets positioned in a substantial vertical plane. Another object is to disclose a method of using the same such that improved MRI scans are obtained.

BRIEF DESCRIPTION OF THE DRAWINGS

Embodiments of the current invention are described hereinbelow with reference to the following drawings.

DETAILED DESCRIPTION

The following description is provided in order to enable any person skilled in the art to make use of the invention and sets forth the best modes contemplated by the inventor of carrying out this invention. Various modifications, however, will remain apparent to those skilled in the art, since the generic principles of the present invention have been defined specifically to provide an MRI device with a plurality of enter ports and to methods using the same.

The term 'Magnetic Resonance Device' (MRD) specifically applies hereinafter to any Magnetic Resonance Imaging (MRI) device, any Nuclear Magnetic Resonance (NMR) spectroscope, any Electron Spin Resonance (ESR) spectroscope, any Nuclear Quadruple Resonance (NQR) spectroscope or any combination thereof. The MRD hereby disclosed is optionally a portable MRI device, such as the ASPECT Magnet Technologies Ltd commercially available devices, or a commercially available non-portable device. The MRD hereby disclosed is optionally a lab-scale or experimental MRI device.

As used herein, the term "animal" or "mouse" generally refers in an interchangeable manner to any living creature, such as neonates, other mammal such as mice, rats, cats, dogs, rabbits etc and laboratory animals.

As used herein, the term "plurality" refers in a non-limiting manner to any integer equal or greater than 1.

Figure 1:
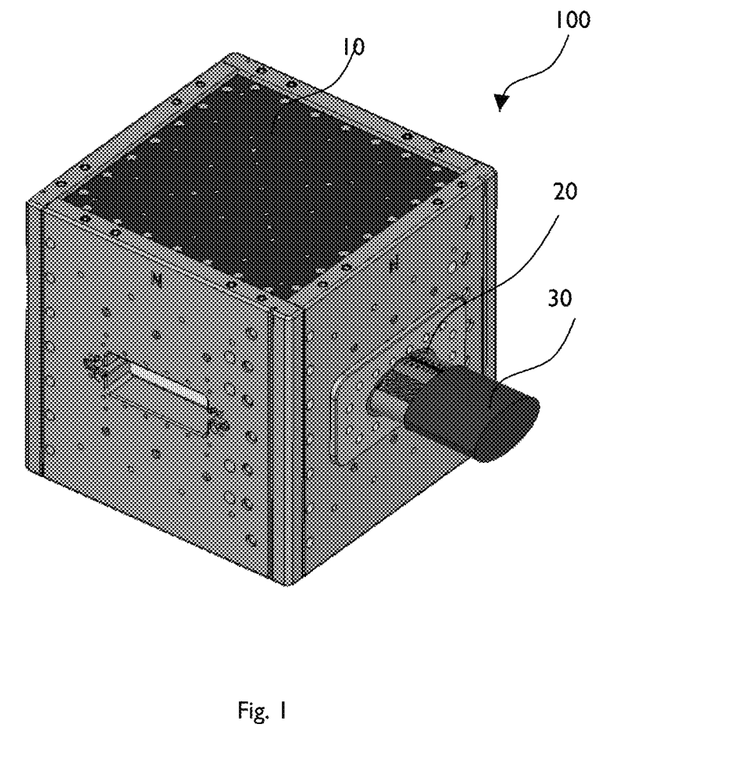
FIG. 1 shows an MRD device including at least one opening with an associated flange, in accordance with a preferred embodiment of the present invention.

Reference is now made to FIG. 1, schematically illustrating (not to scale) an MRD 100, here, an MRI device, comprising at least one opening with associated flange 20. The main magnets are positioned horizontally, see for example plate 10. MRD 100 comprises a mouse handling system (MHS, 30) which is inserted within opening 20.

Figure 2:
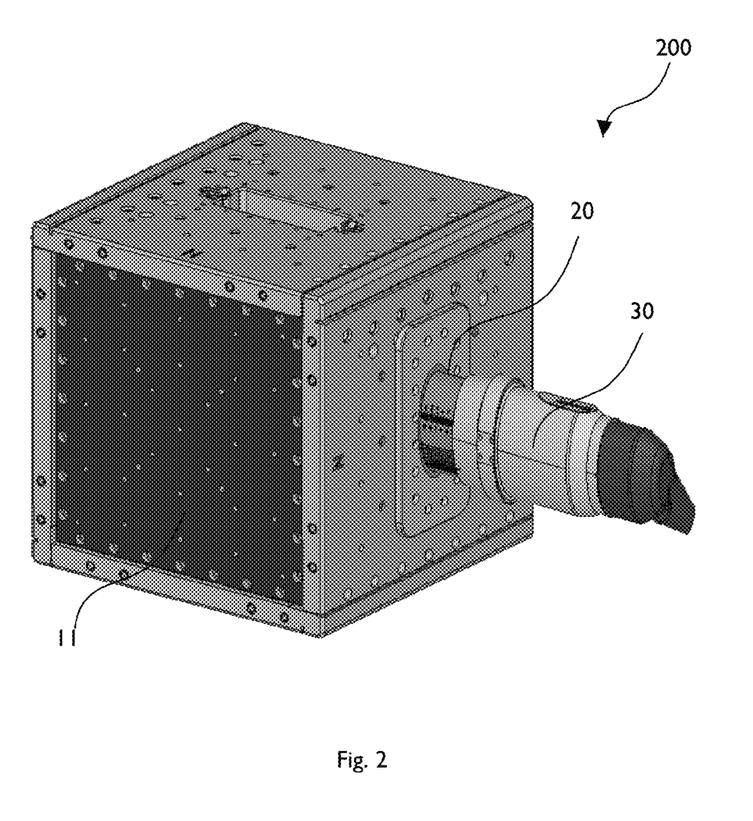
FIG. 2 shows an MRD device including at least one opening and associated flange, in accordance with a preferred embodiment of the present invention.

Reference is now made to FIG. 2, schematically illustrating (not to scale) MRD 200 of the present invention. MRD 200, here, an experimental, lab-scale size MRI device, comprising at least one opening and associated flange 20. MHS 30 is inserted within the opening. The improvement of this MRD is that main magnets are substantially vertical, as presented in plate 11.

Figure 3:
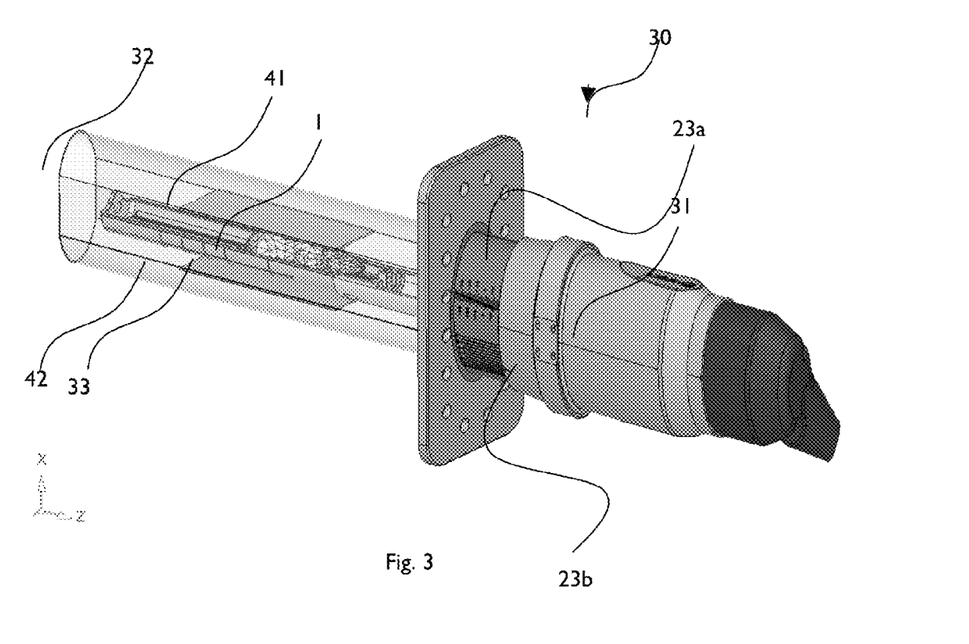
FIG. 3 shows a detailed view of an Mouse Housing System (MHS), in accordance with a preferred embodiment of the present invention.

Reference is now made to FIG. 3, schematically illustrating (not to scale) a detailed view of MHS 30. MHS is characterized by a proximal maneuverable portion 31, close to the operator, and a distal portion, insertably provided within the MRD. This inner portion, made of MRI-compatible materials, such as polymers, comprises inter alia a cradle or bed-like member 33, on which a scanned animal 1 is horizontally immobilized. In this drawing, the animal and its cradle are encapsulated within a plastic cover 32. A plurality of surface coils is intimately covering the animal. Main magnets of MRD 200 are positioned vertically (not shown), and thus surface coils or surface plates 41, 42 are positioned horizontally, gently clutching animal 1 in a vertical plane, namely from top and bottom.

Figure 4:
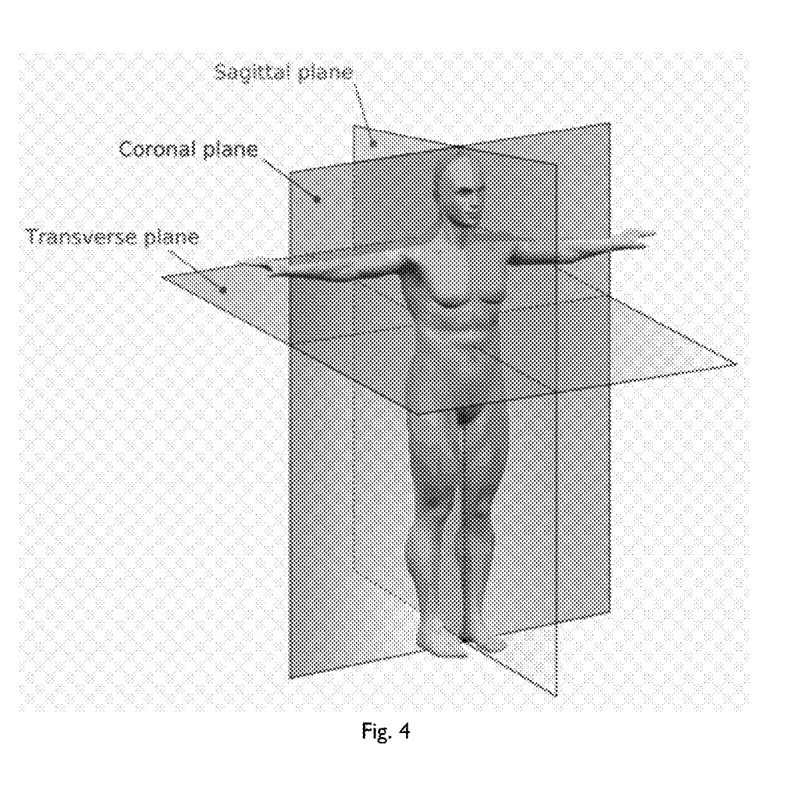
FIG. 4 shows an MHS system a distal and horizontal configuration, in accordance with a preferred embodiment of the present invention.

It is acknowledged in this respect that laboratory animals, such as rodents and similar, have a skeleton that allow them to be pressed to some extent along their sagittal plane, whilst animals such as humans and other primates cannot be substantially pressed naturally along their coronal nor transverse planes (see the planes in FIG. 4).

Reference is again made to FIG. 3, schematically illustrating (not to scale) MHS 100 in a distal (40 mm) and horizontal) (180°) configuration, i.e., animal 1 is reciprocally displaced distally, where cradle 31 immobilizing the animal is place horizontally. Indicia 23a and 23b indicate the same.

Figure 5A:
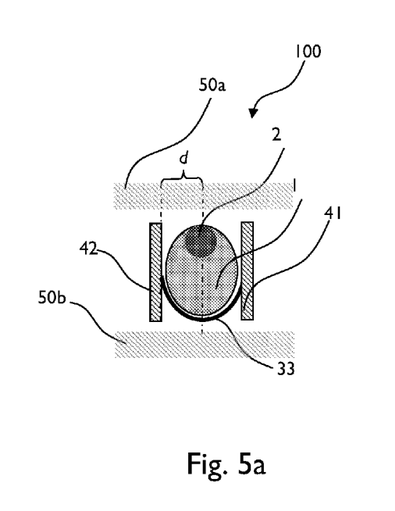
FIG. 5a and FIG. 5b show a conventional MRD device and inventive MRD device, respectively, in accordance with a preferred embodiment of the present invention.
Figure 5B:
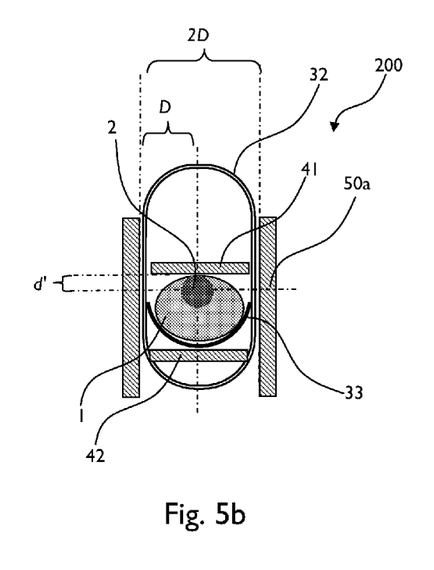

Reference is now made to FIG. 5a (prior art, MRD 100) and FIG. 5b (new invention, MRD 200), both schematically illustrating (not to scale) a cross section of MHS 30 inserted within the MRD. Refering now to FIG. 5a, main magnet 50a and 50b are positioned horizontally, whereas surface coils 41 and 42 are positioned vertically. Animal 1 immobilized on top of cradle 33 As is, namely, with no pressing along its sagittal plane. The animal thus is characterized by an irregular approximated circular portion. One section of the animal to be scanned, here brain 2, is located at the most upper portion of the animal. The distance between the center of the scanned brain 2 and surface plate 42, value d, is noticeable. Reference is now made to FIG. 5b showing one embodiment of the invention. Main magnet 50a and 50b are positioned vertically, whereas surface coils 41 and 42 are positioned horizontally. Animal 1 immobilized on top of cradle 33 and encapsulated within envelope 32 in a manner such that the surface plates gently and safely press along its sagittal plane. The animal thus is characterized by an approximated oval portion. One section of the animal to be scanned, here again brain 2 is located at the most upper portion of the animal. The distance between the center of the scanned brain 2 and surface plate 41, value d' is significantly smaller than value d, where d>>d'. The closer the gap between the scanned organ and the surface coils or plates, the greater is the scan quality. A comparison between FIGS. 5a (prior art) and 5b (the present invention) show that at a given distance between the scanned organ and main magnets D, and at a given distance between main magnets themselves, 2D, the quality of MRI scans is much better in the hereto presented new MRD 200.

It is well within the scope of the present invention, wherein MRD 200 is suitable for improved scanning results not only where animals are analyzed, but also for many other objects. Hence for example, a microwell, known also as microtiter plate or microplate or microwells or microwell array (herein after: 'microwell') which is a flat plate with multiple "wells" used as small test tubes are scanned at higher quality by this new technology. The microplate has become a standard tool in analytical research and clinical diagnostic testing laboratories. A very common usage is in the enzyme-linked immunosorbent assay (ELISA), the basis of most modern medical diagnostic testing in humans and animals. MRI-based reaction and product analysis have become common laboratory procedures, where good quality MRI scans are essential.

Figure 6A:
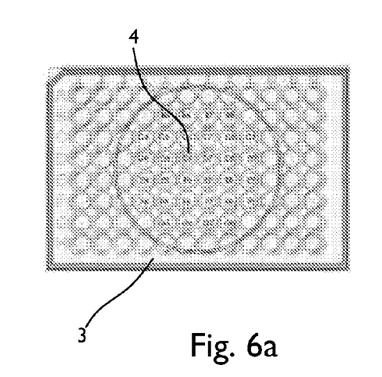
FIGS. 6a-6c show a microwell having a body including an array of small vertically positioned holes, in accordance with a preferred embodiment of the present invention.
Figure 6B:
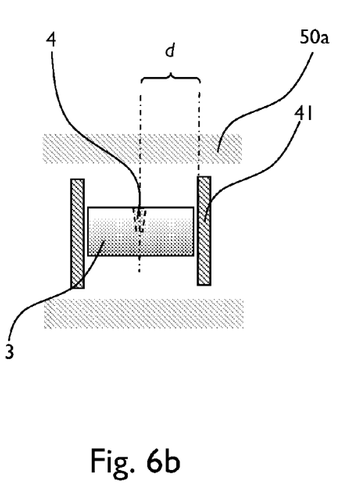
Figure 6C:
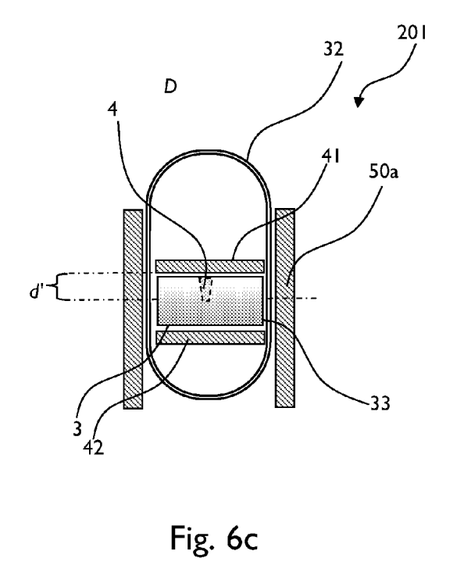

Reference is thus made to FIGS. 6a-6c, schematically illustrating (not to scale) a microwell having a body 3 and array of small vertically positioned holes (4). If MRD type 100 is used (see FIG. 6b, prior art), distance d between the analyzed microwell 4 and surface plate 41 is respectively long, indicating of a poor scan quality. Nevertheless, when the new MRD type 200 is used (see FIG. 6c), distance d' between the analyzed microwell 4 and surface plate 41 is respectively short, providing high quality scans. Here again, the distance between the center of the scanned microwell 4 and surface plate 41, value d' is significantly smaller than value d, where d>>d'. The closer the gap between the scanned organ and the surface coils or plates, the greater is the scan quality. FIGS. 6a-6c show that at a given distance between the scanned organ and main magnets D, and at a given distance between main magnets themselves, 2D, the quality of MRI scans is much better in the hereto presented new MRD 200.

Examples of various features/aspects/components/operations have been provided to facilitate understanding of the disclosed embodiments of the present invention. In addition, various preferences have been discussed to facilitate understanding of the disclosed embodiments of the present invention. It is to be understood that all examples and preferences disclosed herein are intended to be non-limiting.

Although selected embodiments of the present invention have been shown and described individually, it is to be understood that at least aspects of the described embodiments may be combined.

Although selected embodiments of the present invention have been shown and described, it is to be understood the present invention is not limited to the described embodiments. Instead, it is to be appreciated that changes may be made to these embodiments without departing from the principles and spirit of the invention, the scope of which is defined by the claims and the equivalents thereof.

What is claimed is:

1. An animal handling system (AMS) for positioning an immobilized animal within an imaging medical device; said system having a proximal portion held out of said imaging device and a distal portion insertable into said imaging medical device, said system comprising
   a. at least two tubular members telescopically maneuverable one relative to another; and
   b. maneuverable telescopic mechanism provided in said proximal portion and configured for mutually maneuvering said at least two tubular members telescopically maneuverable one relative to another;
   wherein said proximal portion is provided with indicia indicating mutual linear and rotational displacement between said tubular members; and
   wherein said distal portion accommodates an encapsulable life support system (ELSS) comprising a cradle on which said animal is immobilized, said ELSS is rotatable about an axis of said at least two tubes and translationally moveable along said axis by means of said maneuverable telescopic mechanism such that said animal is accurately and reversibly configured within said medical device thereby optimizing animal analyses.

2. The AMS of claim 1, further comprising:
a fluid supplying mechanism comprising a anaesthetization gas mask characterized by a cup having a conic cross section and comprising a plurality of apertures located on an outer circumference of said cup, said fluid supplying mechanism is in a continuous fluid communication with at least one of the following:
   i. an anaesthetization gas inlet positioned outside the ELSS and an outlet located within the ELSS;
   ii. an air suction scavenging device positioned outside the ELSS and an air suction outlet located within the ELSS; and
   iii. a plurality of air conditioning tubes; and
an airtight shell enveloping said ELSS;
wherein said airtight ELSS prevents leakage of anaesthetization gas from said ELSS to the outside environment, provides thermal isolation between the outside environment and the air-conditioned ELSS environment and avoid accidental spillage of hazardous materials.

3. The AMS according to claim 2, wherein said anaesthetization gas mask, said fluid supplying mechanism are adapted by means of size and shape, to ensure anaesthetization of laboratory animals.

4. The AMS according to claim 2, wherein said anaesthetization gas mask, said fluid supplying mechanism are adapted by means of size and shape, to ensure anaesthetization of laboratory animals.

5. The AMS according to claim 1, wherein said medical device comprises a magnetic resonance imaging device.

6. A method for positioning an immobilized animal in a predefined configuration within an imaging medical device, comprising:
providing an animal handling system, the animal handling system comprising at least two tubular members telescopically maneuverable one relative to another; and a maneuverable telescopic mechanism configured for mutually maneuvering said at least two tubular members telescopically maneuverable one relative to another,
wherein said system has a proximal portion and a distal portion; said proximal portion is provided with indicia indicating mutual linear and rotational displacement between said tubular members, and said distal portion accommodates an encapsulable life support system (ELSS) comprising a cradle on which said animal is immobilized; and
wherein said method comprises a step of insertion of said distal portion into said imaging medical device; and at least one step of the following: a step of rotating said ELSS about an axis of said at least two tubes and a step of translationally moving said ELSS along said axis by means of said maneuverable telescopic mechanism.

7. The method according to claim 6, wherein said imaging medical device is a magnetic resonance imaging device.

8. The method according to claim 6, wherein said animal handling system further comprises an anaesthetization gas mask and a fluid supplying mechanism adapted by means of size and shape, to ensure anaesthetization of laboratory animals.

* * * * *